United States Patent
Ivansen

(10) Patent No.: US 7,650,588 B2
(45) Date of Patent: Jan. 19, 2010

(54) METHODS AND SYSTEMS FOR PATTERN GENERATION BASED ON MULTIPLE FORMS OF DESIGN DATA

(75) Inventor: Lars Ivansen, Solna (SE)

(73) Assignee: Micronic Laser Systems AB, Taby (SE)

( * ) Notice: Subject to any disclaimer, the term of this patent is extended or adjusted under 35 U.S.C. 154(b) by 148 days.

(21) Appl. No.: 11/526,864

(22) Filed: Sep. 26, 2006

(65) Prior Publication Data

US 2007/0130558 A1    Jun. 7, 2007

Related U.S. Application Data

(60) Provisional application No. 60/719,974, filed on Sep. 26, 2005.

(51) Int. Cl.
*G06F 17/50* (2006.01)
*G03F 1/00* (2006.01)
*G03C 5/00* (2006.01)

(52) U.S. Cl. .............. 716/21; 716/1; 716/19; 716/20; 430/5; 430/30

(58) Field of Classification Search ............ 716/1, 716/4, 19–21; 257/347, 432; 430/5, 30
See application file for complete search history.

(56) References Cited

U.S. PATENT DOCUMENTS

| | | | | |
|---|---|---|---|---|
| 5,847,959 | A * | 12/1998 | Veneklasen et al. | 700/121 |
| 6,185,727 | B1 * | 2/2001 | Liebmann | 716/19 |
| 6,504,644 | B1 * | 1/2003 | Sandstrom | 359/291 |
| 6,717,097 | B1 | 4/2004 | Sandstrom et al. | 219/121.6 |
| 6,868,231 | B2 * | 3/2005 | Irving et al. | 396/322 |
| 6,978,438 | B1 * | 12/2005 | Capodieci | 716/21 |
| 7,009,753 | B2 * | 3/2006 | Sandstrom | 359/291 |
| 7,055,127 | B2 * | 5/2006 | Pierrat et al. | 716/19 |
| 7,088,468 | B1 | 8/2006 | Thurén | 358/1.7 |
| 7,155,698 | B1 * | 12/2006 | Gennari | 716/19 |
| 7,159,197 | B2 * | 1/2007 | Falbo et al. | 716/4 |
| 7,242,012 | B2 * | 7/2007 | Leedy | 250/492.1 |
| 7,328,425 | B2 * | 2/2008 | Olsson et al. | 716/21 |
| 7,405,414 | B2 * | 7/2008 | Sandstrom | 250/492.22 |
| 7,444,616 | B2 * | 10/2008 | Sandstrom et al. | 716/21 |
| 7,536,670 | B2 * | 5/2009 | Percin et al. | 716/19 |
| 2006/0002603 | A1 * | 1/2006 | Beauchaine et al. | 382/141 |
| 2006/0053406 | A1 | 3/2006 | Ivansen | 716/20 |
| 2008/0127031 | A1 * | 5/2008 | Olsson et al. | 716/21 |
| 2009/0037868 | A1 * | 2/2009 | Chabreck et al. | 716/20 |

* cited by examiner

*Primary Examiner*—Helen Rossoshek
(74) *Attorney, Agent, or Firm*—Harness, Dickey & Pierce, P.L.C.

(57) ABSTRACT

In a pattern generation method, properties of designs are extracted in a mask data preparation system, and the properties are propagated to a lithography write system. A pattern is generated based on fractured design data and the extracted properties. By preserving the design intent to the lithography write system, the fidelity of the pattern replication may improve.

6 Claims, 7 Drawing Sheets

Original design data are combinations of rectangles, trapezoids and polygons. They may overlap as in area 1+2.

After overlap removal and repolyonization, the data is refined into non-overlapping polygons. All vertices become true corners by definition.

The corner at vertex V(n) are defined by V(n+1) and V(n-1). The location, angle and orientation of the corner can be extracted.

An isolated corner may receive full amplification on the enhancement mechanism.

Corners in proximity may receive down weighted amplification of the enhancement to suppress interference.

The polygon before fracturing defines the outline.

Ambiguous edge properties at cut lines a-b and c-d

Ambiguous edge properties at cut lines a-b and c-d

After additional fracturing, all cut lines become unambiguous.

METHODS AND SYSTEMS FOR PATTERN GENERATION BASED ON MULTIPLE FORMS OF DESIGN DATA

PRIORITY STATEMENT

This non-provisional U.S. patent application claims priority under 35 U.S.C. § 119(e) to provisional U.S. patent application Ser. No. 60/719,974, filed on Sep. 26, 2005 in the United States Patent and Trademark Office. The entire contents of this provisional patent application are incorporated herein by reference.

BACKGROUND

Lithography is the process of writing a circuit design (or geometry) onto a mask. Related art lithography (or write) equipment, writes the geometry onto a plate by exposing a resist with a laser or a charged beam. This exposure changes the molecular composition of the resist, and during a developing process the exposed resist is removed. In some alternative applications, a negative resist is used. In this case, the non-exposed resist is removed during a developing process.

Photomasks (or masks) are relatively high precision plates containing microscopic images of electronic circuits. Photomasks are made from substrates, such as, for example, relatively flat pieces of, for example, quartz or glass with a layer of chrome on one side. Etched in the chrome is a portion of an electronic circuit design. This circuit pattern on the mask is also referred to as a geometry.

Masks are used in related art methods of wafer fabrication and wafer writer systems, to create, for example, integrated circuits (ICs). ICs are used in products, such as, computers, calculators, cars, cameras, stereos, etc. Masks are also used in producing flat panel displays, thin film heads, PC boards, etc.

In a related art method of manufacturing a mask, a circuit pattern is designed (e.g., by a customer), and the designed pattern information is digitized. The digitized pattern design data containing a design for a mask is then provided to a mask manufacturer. One or more layers of the pattern design data form a single mask, and an IC circuit comprises a plurality of layers (e.g., about 40 for relatively high-end designs), however, each layer of the resultant circuit may be formed by a single mask in a wafer manufacturing process. The digitized pattern design data may be provided to the mask manufacturer on a disk, magnetic tape, via Internet, dedicated lines, etc.

The mask manufacturer formats the received data for the write or pattern generation system. The formatting may include, for example, fracturing the data, sizing the data, rotating the data, adding fiducials and internal reference marks, and creating instructions for the placement of all the different patterns on the mask, also known as a "jobdeck." The jobdeck contains instructions describing how to print the mask, what pattern files to use, what layers in the pattern files to use and what transformations to apply. Jobdecks and information included therein are well-known in the art, and therefore, a detailed discussion will be omitted for the sake of brevity.

In one related art method of fracturing data, pattern design data is translated into a language the write system understands. For example, if the pattern to be written is a polygon shape, but related art write systems understand rectangles and trapezoids, the design pattern data is fractured into rectangles and trapezoid shapes. The jobdeck with the fractured data is stored on a computer readable medium (e.g., a disk, flash memory, compact-disc, etc.) and sent to the write system. The write system then prints the pattern on the substrate using the formatted design pattern.

During printing, additional pattern processing takes place. For example, geometries may be spatially re-organized to match a writing sequence of a writing tool and rendered into pixels to be imaged by the exposure system.

A writer system has relatively little understanding of the pattern to be printed on the substrate. The writer system is fed with relatively large amounts of primitive geometries to be printed, but the primitive geometries do not form a meaningful whole until the mask is completely written. Some areas of the design, however, may be more critical than others. For example, some portions of the design may have a higher mask error enhancement factor (MEEF), may have a greater impact on the critical dimension (CD) of the printed pattern and/or may be more critical for proper area coverage. Information regarding the relative significance of these aspects of the design may be available in processing steps upstream from the writing system; however, in related art pattern generation systems, this information is unused and lost as the design pattern data propagates down stream and eventually is printed on a substrate.

Related art lithography writer systems have a finite resolution. Because corners of the pattern represent an infinite spatial frequency, the replication of the design pattern data onto the substrate is compromised, for example, corners of the pattern become rounded. By adding or subtracting energy in the corners, or in the close proximity to the corners, sharpness may be improved. However, a writer system is supplied with fractured data (primitive geometries) that are part of more complex shape, and the relation between the primitive geometries and the shapes they form when combined is lost during fracturing, and thus, is not conveyed to the writer system.

In addition, in a raster based system, no information regarding corners of the pattern is available because the image representation is an approximation of vector data. With just the raster image as input, corners of the pattern must be recreated using advanced search algorithms. However, in this case, the search is relatively difficult and complex because the raster image has a lower resolution than the vector data.

SUMMARY

Example embodiments provide increased fidelity of the mask and/or improved focus of the computer processing power by propagating refined design data information to the writing system. Example embodiments may improve pattern replication on a mask.

Combining corner metadata with the image may provide improved corner precision. For example, the metadata may pinpoint precise or more precise locations of corners and/or control the direction and amplification corner enhancement functions.

Example embodiments may have improved fidelity and/or be able to focus computing power in more critical area by distinguishing between true and false corners and knowing their position, angles and orientation.

In a pattern generation method, according to at least one example embodiment, design data associated with a pattern is formatted to generate a fractured pattern and metadata associated with the pattern in an unfractured format. A pattern is then generated based on the fractured data and the metadata.

Another example embodiment provides a pattern generation method. In this example embodiment, fractured design data and metadata may be received and a pattern may be generated based on the fractured design data and the metadata, wherein the metadata describes the design data prior to fracturing.

Another example embodiment provides a method for generating a pattern based on design data. In this example embodiment, the design data may be processed to generate a non-overlapping polygon representation of the design data. Metadata including at least one of corner and edge properties associated with the non-overlapping polygon representation may be generated. The non-overlapping polygon representation may be fractured, and a pattern may be generated based on the generated metadata and fractured non-overlapping polygon representation.

Another example embodiment provides a pattern generation system. The pattern generation system may include a data preparation module and a pattern generator. The data preparation module may be configured to format design data to generate fractured data and metadata, the metadata describing the design data prior to fracturing. The pattern generator may generate a pattern based on the fractured data and the metadata.

Another example embodiment provides a pattern generation method. In this example embodiment, design data describing a pattern to be generated is received, and processed to generate a non-overlapping polygon representation of the design data. Metadata may be generated from the polygon representation, and the polygon representation may be fractured. The fractured polygon representation and the metadata may be transmitted, in parallel, to a pattern generator for generating the pattern. The generated metadata may be encoded prior to transmitting.

Another example embodiment provides a pattern generation method. In this example embodiment, design data describing a pattern and metadata describing at least one of critical and non-critical areas of the design of the pattern may be received. Filler data may be generated based on at least one of the received design data and the received metadata. Additional metadata identifying the generated filler data may be transmitted, and the filler data may represent areas non-critical to the design of the pattern.

Another example embodiment provides an apparatus in a lithographic system. The apparatus may include means for receiving design data describing a pattern and metadata describing at least one of critical and non-critical areas of the design of the pattern, means for generating filler data based on at least one of the received design data and the received metadata, and means for transmitting additional metadata identifying the generated filler data. The filler data may represent non-critical areas of the design of the pattern.

Another example embodiment provides an apparatus in a lithographic system. The apparatus may include means for receiving design data describing a pattern to be generated, means for processing the received design data, means for generating a non-overlapping polygon representation of the design data based on the processing of the received design data, means for generating metadata from the polygon representation, means for fracturing the polygon representation, and means for transmitting the fractured polygon representation and the metadata.

Another example embodiment provides an apparatus in a lithographic system. The apparatus may include means for receiving fractured design data and metadata, and means for generating a pattern based on the received fractured design data and the received metadata.

In example embodiments, the metadata may include properties associated with at least one of corners and edges of the pattern. For example, the metadata may include at least one of spatial location data, opening angle data, orientation data and isolation data associated with at least one corner of the pattern. The pattern may be a polygon representation of at least a portion of the design data.

In example embodiments, the data preparation module may be further configured to process the received design data to generate a non-overlapping polygon representation of the design data, extract metadata from the polygon representation, fracture the polygon representation and transmit the fractured polygon representation and the metadata to the pattern generator in parallel. The data preparation module may encode the metadata with the fractured data prior to transmitting.

In example embodiments, the metadata may be received in a data flow different from a data flow associated with the fractured polygon representation, or in a bundled data flow.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting and wherein.

DETAILED DESCRIPTION OF EXAMPLE EMBODIMENTS

From design to mask, the pattern design data undergoes multiple transformations over a plurality of stages. At each stage, some information is lost as the pattern design data propagates down stream eventually being written on a substrate to create a mask. Hence, each stage represents an opportunity to preserve information for the benefit of data processing further down stream. Regardless of whether the pattern design data is generic or machine specific, the pattern design data represents geometry and structural constructs in layers. The pattern design data also includes properties associated with the layers, the geometry data and structural constructs. In at least one example embodiment, an additional layer may be added to the pattern design data. The additional layer may define pre-fractured polygon shapes within the pattern to be printed, and characteristics, properties and/or attributes of the polygons may be encoded as metadata. By projecting the additional layer onto a layer with geometry data, the geometry data may be associated with various metadata information.

Figure 1:
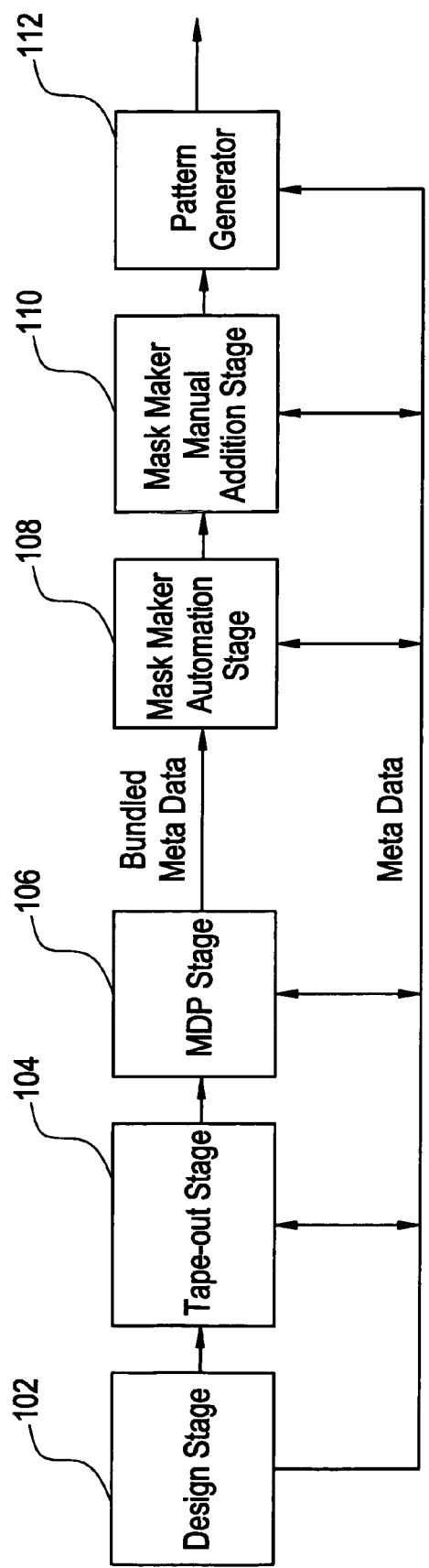
FIG. 1 illustrates a multi-stage pattern generation system, according to an example embodiment.

FIG. 1 illustrates a multi-stage pattern generation system, according to an example embodiment, including six stages. At five of the six stages, metadata may be extracted and fed forward to at the pattern generator 112 to generate a desired pattern.

Referring to FIG. 1, at the design stage 102, the design pattern is available by definition. For example, the design intent or how the pattern is intended to print on a final wafer is available. Included in this information regarding the design intent is information regarding a figure of merit (FoM) and/or information regarding critical versus non-critical areas of the mask to be patterned at the pattern generator 112.

An example of a critical area of the mask is a portion at which timing critical memory cells are to be located, whereas non-critical areas are those areas in which, for example, the company logo is to be printed. Due to limited optical resolution of related art wafer writing systems (e.g., the stepper and/or the scanner), however, the image on the mask typically differs from that on the wafer. The information regarding critical versus non-critical areas of the mask may be used as metadata, which may enable the pattern generator 112 to focus efforts for pattern fidelity where required, such as, those critical areas of the mask. According to example embodiments, the critical versus non-critical areas of the mask in the form of metadata may be fed forward to the pattern generator 112 shown in FIG. 1.

In addition, or alternatively, a FoM for each corner of the design pattern may also be available at the design stage 102. FoM for a particular corner of the design pattern may represent a measure of the isolation at each corner. FoM is a function of the degree of isolation of one corner relative to other corners in the same geometry and from corners on neighboring geometries. Methods for determining a FoM are well-known in the art, and therefore, a detailed discussion will be omitted for the sake of brevity. FoM for corners of the design pattern may also be fed forward to the pattern generator 112 as metadata.

At the tape-out stage 104, the pattern design data undergoes (or has undergone already) pattern data resolution enhancement, such as, optical proximity correction (OPC) processing. OPC processing is an example of a pattern data resolution enhancement technique (RET) for a wafer patterning process. However, other RET techniques may be used. The OPC processed data represents how the pattern is intended to print on the mask. Here, outer (or true) edges and/or true corners of polygons are available as metadata. Even if portions of the pattern design data contain overlaps, and consequently, false edges and/or corners, the information may still be used as metadata because information regarding true outer edges and/or true corners may still exist.

In addition, at the tape-out stage 104, filler may be applied on metal layers to enable chemical mechanical polishing (CMP) of the chrome surface of substrate. The filler can occupy as much as about 50% of the total area of the geometry, but may not be considered critical to the design. Location of the filler may also be encoded as metadata and provided to the pattern generator 112.

At the tape-out stage 104, the design pattern data may be generic design pattern data, such as, Graphic Design System II (GDSII) or Open Artwork System Interchange Standard (OASIS), each of which are well-known hierarchical design formats.

At the MDP processing stage 106, the pattern design data is formatted for a particular pattern generator, such as, pattern generator 112. The formatting may include, for example, overlap removal, re-polygonization and fracturing. When the design pattern data is fractured information regarding outer edges and/or true corners of the pattern is lost. Thus, in accordance with example embodiments, information regarding outer edges (or true edges) and true corners of the pattern design may be extracted before the pattern design data is fractured at the MDP processing stage 106. The extracted information may be encoded as metadata, and the encoded metadata generated at the MDP processing stage 106 may be fed forward to the pattern generator 112.

Figure 2:
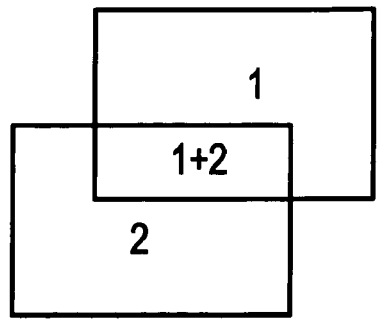
FIG. 2 shows an example representation of pattern design data including overlapping polygons.

In one example embodiment, at the MDP processing stage 106, overlap removal and re-polygonization of the non-overlapping design pattern data may be performed. The overlap removal and re-polygonization may combine adjacent and overlapping geometries into a non-overlapping polygon. FIG. 2 shows an example representation of pattern design data including overlapping polygons and FIG. 3 illustrates the re-polygonized pattern design data after overlap has been removed.

Referring to FIG. 2, the design pattern data from the tape-out stage 104 may be in the form of combinations of polygons, such as, rectangles, trapezoids, etc. For example purposes, the design pattern data in FIG. 2 are shown as two rectangles overlapping in area 1+2. Referring to FIG. 3, after overlap removal and re-polygonization are performed, a non-overlapping polygon representation of the design pattern data is generated. As shown in FIG. 3, after re-polygonization, all vertices shown in FIG. 2 become respective true corners a through h in FIG. 3. Methods for overlap removal and re-polygonization are well-known in the art, and therefore, a detailed discussion will be omitted for the sake of brevity.

Returning to FIG. 1, as discussed above, after re-polygonization, information regarding (e.g., properties associated with) the re-polygonized design pattern data may be extracted prior to fracturing. Information regarding the pre-fractured design pattern data may include, for example, corner properties and/or edge properties. Corner properties may include, for example, spatial location data, opening angle data, orientation data and/or isolation data.

Figure 3:
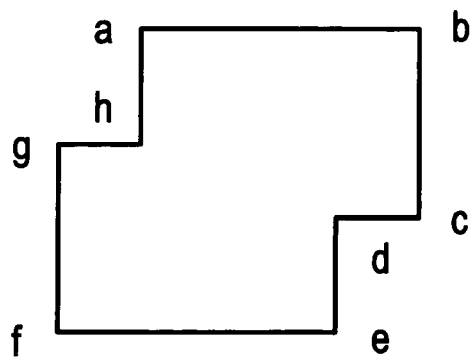
FIG. 3 illustrates a re-polygonized pattern design data after overlap has been removed from FIG. 2.
Figure 4:
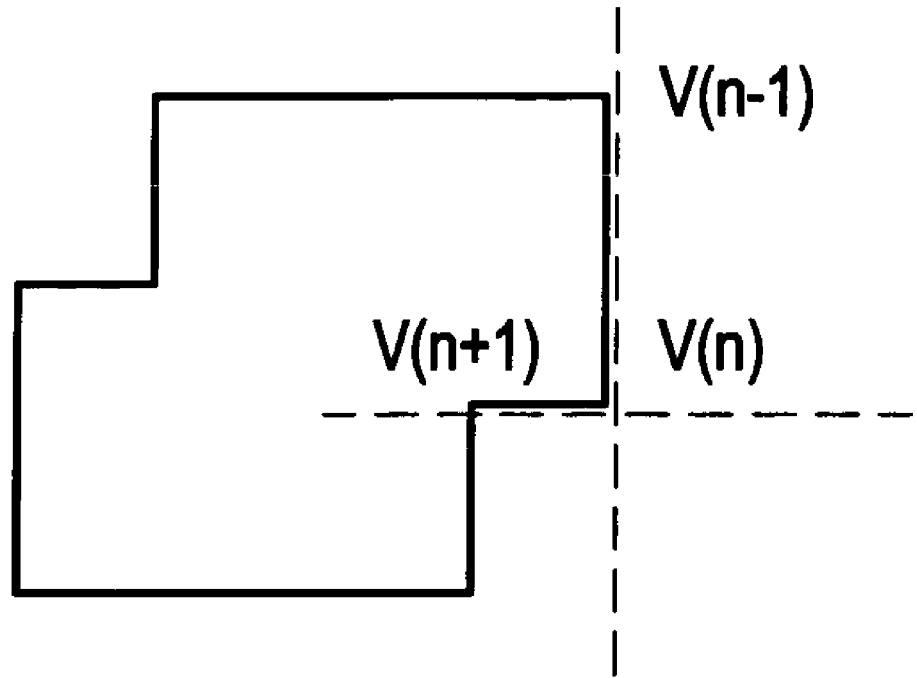
FIG. 4 shows a manner in which properties of the corners of a polygon may be determined.

As can be seen by comparing FIGS. 2 and 3, the overlap removal and re-polygonization refines the original design pattern data and reveals the true outlines of the design pattern to be printed on the substrate. Assuming, for example purposes, that polygons are defined in a consistent direction, clockwise or counter-clockwise, the following observation can be made with respect to the example shown in FIG. 4:

For a vertex V(n); the V(n+1) and V(n−1) in a polygon give the opening angle and the orientation of the corner located at the vertex V(n).

Using the above observation, the location, the opening angle and the orientation of each corner of the polygonal design pattern may be extracted from the polygonal pattern.

Another relatively important quality of corners is their associated isolation. The resolution enhancement of isolated corners may differ from resolution enhancement of corners in proximity. In some example cases, corners in closer proximity may have their resolution enhancement down weighted in order to suppress interference and/or reduce the risk of artefacts.

Figure 5:
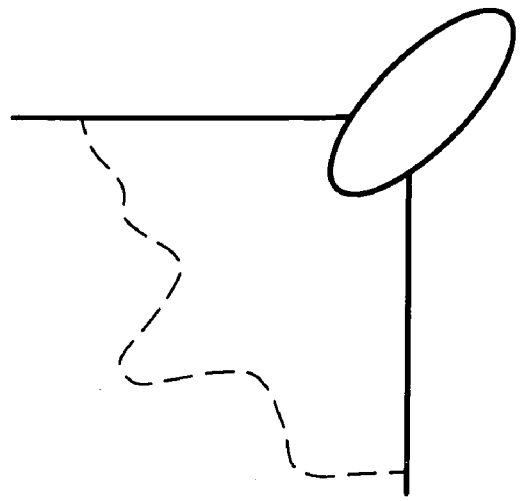
FIG. 5 illustrates isolated corners versus corners in proximity and the corresponding impact on the amplification of a corner resolution enhancement mechanism.
Figure 5:
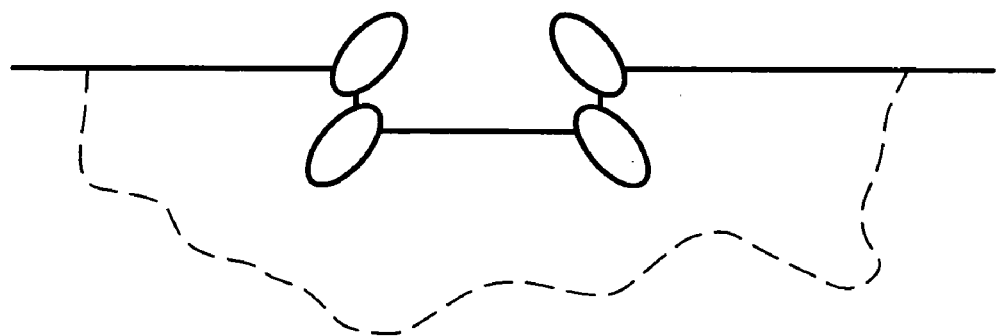

FIG. 5 illustrates isolated corners versus corners in proximity and the corresponding impact on the amplification of a corner resolution enhancement mechanism. Corner proximity information may depend on corners in a single geometry or multiple geometries. That is, for example, corners in a first geometry may be considered in proximity to corners in the same geometry or a second geometry. For each corner, proximity information may be encoded as a measure of the isolation for each corner. As discussed above, the measure of the isolation at each corner may be represented by a figure of merit (FoM). FoM is a function of the degree of isolation of a current corner relative to other corners in the same geometry and from corners on neighboring geometries.

Figure 6:
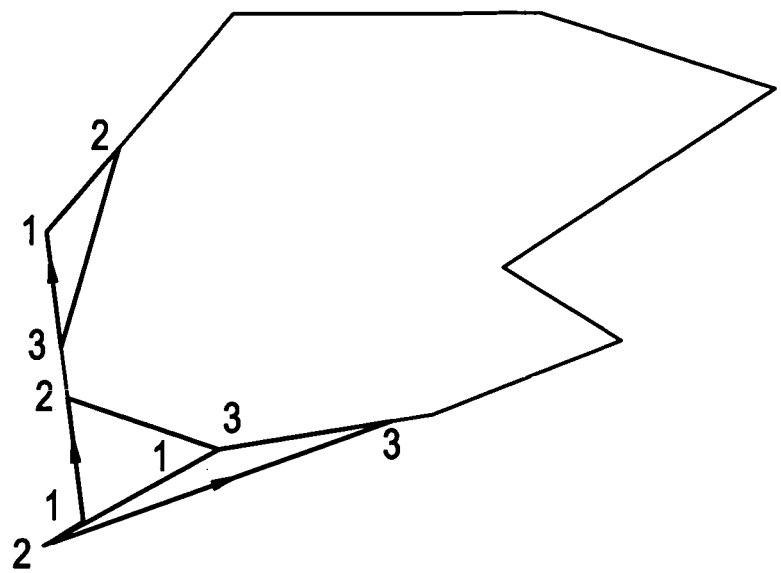
FIG. 6 illustrates an example method for encoding corner properties as metadata.

An example method for encoding the above described corner properties will be described with regard to FIG. 6. As shown in FIG. 6, corner properties may be represented by an isosceles triangle including three coordinate pairs, each of which constitutes a vertex of the triangle. Using the three coordinate pairs (or one coordinate pair and two delta pairs) all, or substantially all, properties, characteristics and/or attributes of a corner may be described.

For example, a first coordinate may be indicative of the corner position, second and third coordinates may be indicative of the set corner angle and opening angles, the direction (indicated by the arrows shown in FIG. 6) may designate the clockwise outer corner and counter-clockwise inner corner, and the length or size of the two equal legs may be indicative of the FoM associated with the particular corner and may be indicative of (and/or used to generate an associated) RET strength.

Alternatively or in addition to the properties associated with corners of the pattern, identifying whether edges represent true edges of the original design pattern may also be beneficial to a writing system or pattern generator because the edges may have a relatively high impact on the critical dimension (CD) of the printed pattern. Identifying the true edges may also enable further edge enhancements such as edge location tuning, edge transition equalizing, etc. In this example, after re-polygonization, an outline of the pattern may be extracted and encoded as metadata.

Figure 7:
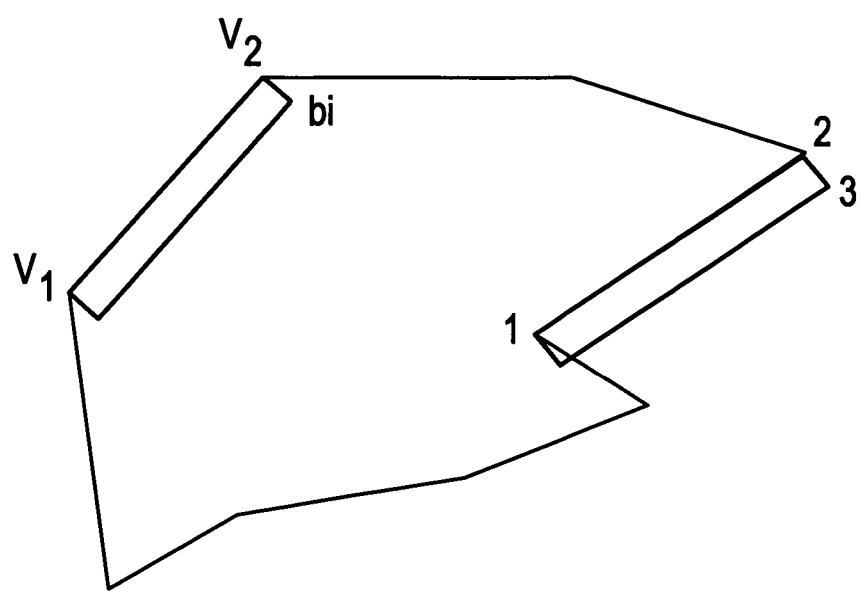
FIG. 7 illustrates an example method for encoding edge properties as metadata.

An outer edges extraction and encoding example will now be described with regard to FIG. 7. Referring to FIG. 7, outer edges may be distinguished from fractured internal edges by assigning metadata in the form of a rectangle to each edge.

As shown, outer edges are marked together with the desired bias to be applied down stream in the data processing. Biasing is a process of changing the size or shape of the mask feature in order for the printed feature size to more closely match the nominal or desired feature size. Because biasing is well-known in the art, a detailed discussion thereof will be omitted for the sake of brevity.

The presence of associated edge metadata indicates that a particular edge is a true edge. In this example referring to FIG. 7, the first edge spans between a first corner $v_1$ and a second corner $v_2$, and the third coordinate bi indicates bias and the direction of bias.

Figure 8A:
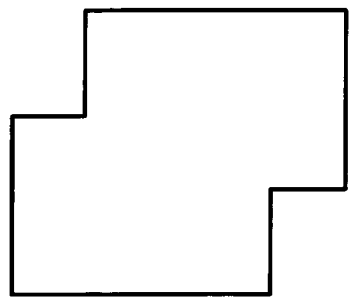
FIG. 8A illustrates an arbitrary polygon before fracturing and FIGS. 8B-8D illustrate different ways in which the polygon of FIG. 8A may be fractured.
Figure 8B:
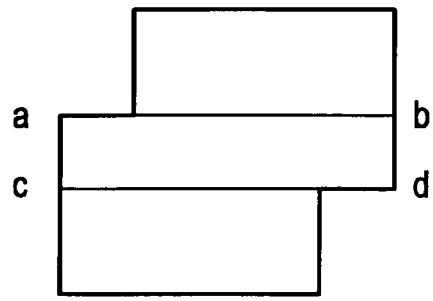
Figure 8C:
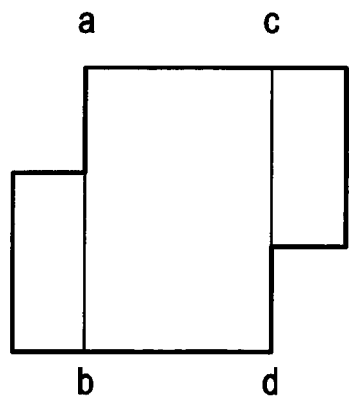
Figure 8D:
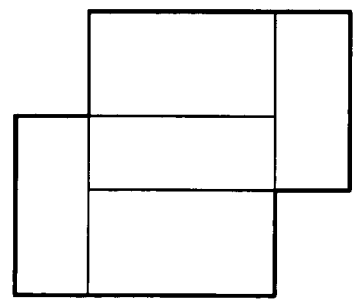

At the MDP processing stage 106, the design pattern data may also be fractured. In a fracturing process, arbitrary polygons may be divided into rectangles and/or trapezoids (also known collectively as primitives) with horizontal trapezoidalization. Methods of fracturing are well-known in the art, and thus, a detailed discussion thereof will be omitted for the sake of brevity. However, for the sake of clarity, FIG. 8A illustrates an arbitrary polygon before fracturing and FIGS. 8B-8D illustrate different ways in which the polygon of FIG. 8A may be fractured. For example, as shown in FIG. 8B the arbitrary polygon may be fractured by generating horizontal cut lines from each vertex. In FIG. 8C, the polygon may be fractured by generating vertical cut lines from each vertex. In FIG. 8D, the polygon may be fractured by generating horizontal and vertical cut lines from each vertex.

Returning to FIG. 1, at the MDP processing stage 106, the encoded metadata may also (or alternatively) be bundled with the fractured pattern design data and transmitted to the pattern generator 112. Bundling is applicable to both generic design pattern data, such as, Graphic Design System II (GDSII) or Open Artwork System Interchange Standard (OASIS). Bundling is also applicable to machinery specific formatted data (e.g., format specific to a mask writer system, such as, a MIC format.

According to at least one example embodiment, metadata may be assigned as properties without any modifications to existing data formats to bundle pattern design data with metadata. For example, the pattern design data may be structured into records, such as, BEGIN_LAYER and END_LAYER. In order to bundle the metadata along with the fractured pattern design data, the metadata may be encapsulated into a record and added to the data file by a computer program running at different stages of data processing (e.g., design, tape-out, etc.). Methods and/or computer programs for doing so are well-known in the art, and therefore, a detailed discussion has been omitted for the sake of brevity.

In example embodiments, the metadata may be bundled with the fractured pattern design data and supplied to the pattern generator. In other example embodiments, the metadata may be supplied via a separate data flow. For example, each of the stages 102-110 may supply the metadata to the pattern generator 112. In other example embodiments, the metadata may be supplied to each stage in the pattern generation system (e.g., the design stage 102 metadata may be supplied to the tape-out stage 104, which may then supply both metadata to the MDP stage 106, etc.), and the resultant metadata may be bundled with the fractured pattern design data.

Whether bundled with the fractured pattern design data or sent in parallel via a different data flow than the fractured pattern design data, the pattern generator 112 may generate a pattern creating a mask using the fractured data and the metadata.

Returning to FIG. 1, at the mask maker automation stage 108, additional control information for controlling the specific pattern generator 112 may be applied by the mask maker or manufacturer, for example, through scripts modifying the jobdeck. For example, information regarding the distinction of critical patterns from non-critical patterns (e.g., identifying logo locations, timestamps, barcodes, etc.). In addition, experimental settings may be applied to match a particular process. This additional information may also be encoded as metadata and fed forward to the pattern generator 112.

At the mask maker manual additions stage 110, the mask data preparation may be a fully automated process, however, the mask maker may manually interact with the writer system. By simply editing the jobdeck, the mask maker may add, complement or remove metadata information provided from one or more of the aforementioned stages.

Returning to FIG. 1, the pattern may be written at the pattern generator 112 using the metadata from one or more of stages 102-110 and the fractured design pattern data from the MDP stage 106 to produce a mask.

In example embodiments, if metadata is supplied to the pattern generator 112, the pattern generator 112 must be made aware of the existence of the metadata. As described above, in mask manufacturing, the pattern design data is accompanied by a jobdeck. Examples of jobdeck are JB (MEBES jobdeck), SEMI P10, MALY (a mask layout data format), etc. As also described above, the jobdeck is a description of how to print the mask, what pattern files to use, what layers in the pattern files to use and what transformations to apply. According to example embodiments, the jobdeck may be extended with information on the availability of metadata that relates to particular layer in the pattern design data or to metadata supplied as separate data files accompanying the pattern design data. This additional information may be supplied at various stages in the data flow, from tape-out to the write stage.

Figure 9:
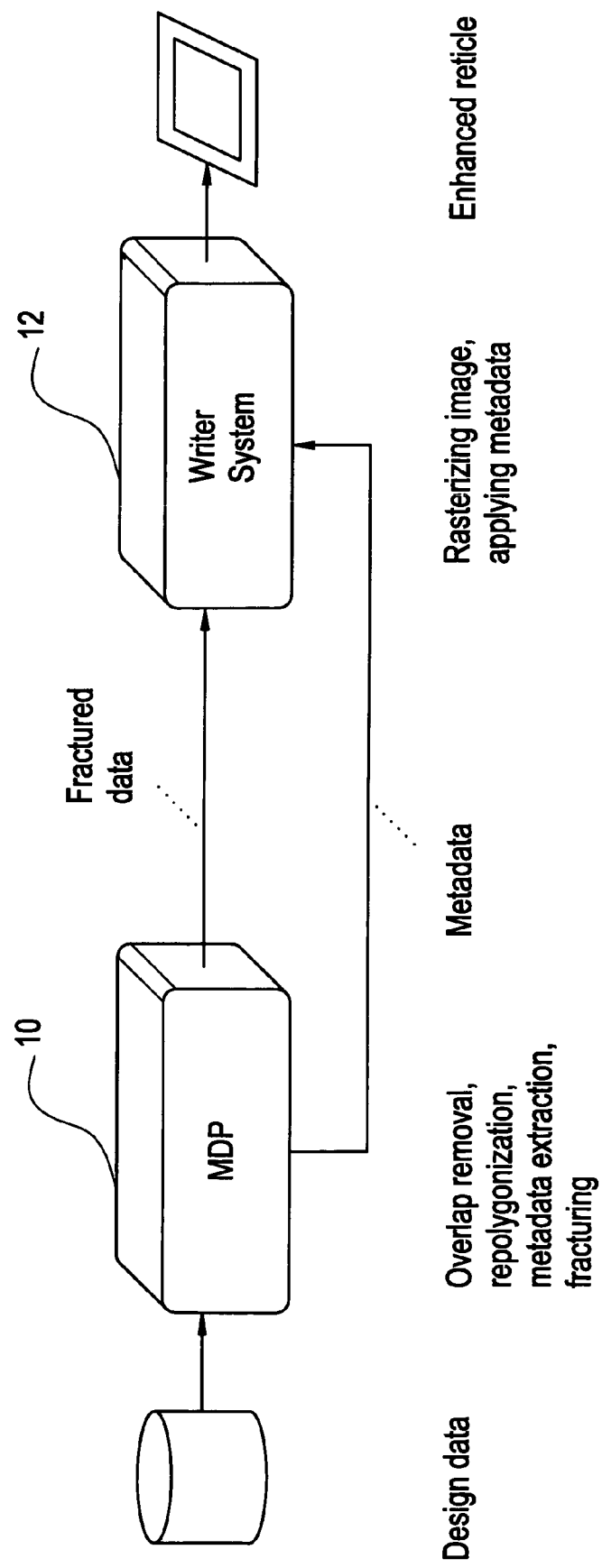
FIG. 9 illustrates a portion of a pattern generation system, according to an example embodiment.

FIG. 9 illustrates a portion of a pattern generation system, according to an example embodiment. As shown, the MDP module 10 may perform the functions discussed above with regard to the MDP stage 106, and the write system 12 may perform the functions discussed above with regard to the pattern generator 112. The data storage may store the design pattern data and metadata from the mask manufacturer.

Example embodiments may be incorporated into existing pattern generation systems.

Referring still to FIG. 9, in another example embodiment, the above-discussed design pattern data from a customer may be stored in a data storage. The data storage may be any suitable computer readable storage medium as is well-known in the art. A mask data preparation (MDP) module 10 may retrieve design data from the data storage and process (or format) the retrieved design data to generate metadata and fractured data. The MDP module 10 may encode the metadata and the fractured data together and output the encoded data to a writer system (or tool) 12.

The writer system 12 may print a pattern on a substrate based on the encoded data from the MDP module 10 to generate a reticle. The encoded data may include both fractured design pattern data and the additional metadata describing aspects of the original design pattern.

Although particular stages are depicted in a particular position (e.g., at the mask designer, at the mask manufacturer), these positions may be re-arranged. For example, although stages 108 and 110 are depicted in FIG. 1 as included within the write stage/writer system, these stages may be outside the write stage and/or performed at a portion of the pattern generation system that is separate from the write system. Other configurations that would be obvious to one of ordinary skill in the relevant art are also possible, but have been omitted for the sake of brevity.

Each stage in the example embodiment shown in FIG. 1 may be implemented using a processor such as a digital signal processor (DSP) or application specific integrated circuit (ASIC). Alternatively, each of the stages in the example embodiment of FIG. 1 may be implemented at least in part in the form of a computer software program stored in a memory or external storage device. Such a program may be executed, for example, by a processor. The processor used to implement and/or execute the functions of the stages may be one of a plurality of processors included at a conventional pattern generation system.

Alternatively, multiple stages (e.g., the design stage 102 and the tape-out stage 104) shown in FIG. 1 may be implemented on a single processor such as a digital signal processor (DSP), application specific integrated circuit (ASIC), or at least in part in the form of a computer software program stored in a memory or external storage device.

Although example embodiments have been described with regard to a mask writer (or pattern generator), example embodiments may also be applicable to a direct writer. A direct writer is a combination of a mask writer system and a wafer writer system (e.g., scanner/stepper). In addition, although example embodiments are discussed above with respect to creation of a "mask," example embodiments are equally applicable in the creation of "wafers."

In at least one example embodiment, a writer system may leverage the metadata information to improve pattern fidelity and throttling compute power of the data processing. For example, using a corner enhancement function in which corners of an image may be sharpened by adding or subtracting energy. This may result in a printed image which more closely matches the ideal intended image as represented by the pattern design data. Absent any metadata indicating the location and/or properties of corners, the corner enhancement algorithm must search the image, locating corners and classify them with respect to their level of isolation, their orientation and their opening angles. With metadata, according to example embodiments, present to supply location and/or FoM of corners of the pattern, the algorithm may be simplified (e.g., limited) to applying dose modulation to the supplied corner location as a function of FoM and machine specific control parameters.

The above-described corner enhancement example may be extrapolated to various additional pattern fidelity improvement functions for pattern generation. One example of such a function is biasing, in which perimeters of geometries are offset with a constant value while preserving their center of gravity.

The above-described corner enhancement example may be extrapolated to be used in mask OPC. In an example of mask OPC, perimeters of geometries are offset as a function of width of present geometry and space to a nearest neighbor geometry.

Example embodiments being thus described, it will be obvious that the same may be varied in many ways. Such variations are not to be regarded as a departure from the present invention defined by the claims.

I claim:

1. A pattern generation method for increased fidelity and/or improved focus of computer processing power, the method comprising:

receiving, at a data preparation module of a pattern generation system, design data describing a pattern to be generated;

processing, by the data preparation module, the received design data to generate a non-overlapping polygon representation of the design data;

generating, by the data preparation module, metadata from the non-overlapping polygon representation, wherein the metadata is associated with the pattern in an unfractured format, and wherein the metadata includes properties associated with at least one of corners and edges of the pattern;

fracturing, by the data preparation module, the non-overlapping polygon representation; and transmitting, by the data preparation module in parallel with one another, the fractured non-overlapping polygon representation and the metadata to a pattern generator adapted for generating the pattern based on the fractured non-overlapping polygon representation and metadata including at least one of corner and edge properties associated with the pattern in an unfractured format.

2. The pattern generation method of claim 1, wherein the metadata is transmitted in a different data flow than a data flow associated with the fractured non-overlapping polygon representation.

3. The pattern generation method of claim 1, further including, encoding the generated metadata prior to transmitting.

4. The pattern generation method of claim 1, wherein the metadata includes at least one of spatial location data, opening angle data, orientation data and isolation data associated with at least one corner of the pattern.

5. A method for generating a pattern based on design data, the method comprising:
   processing, by a data preparation module, the design data to generate a non-overlapping polygon representation of the design data;
   generating, by the data preparation module, metadata including at least one of corner and edge properties associated with the non-overlapping polygon representation prior to fracturing;
   fracturing, by the data preparation module, the non-overlapping polygon representation; and
   generating, by the data preparation module, a pattern based on metadata associated with the non-overlapping polygon representation and the fractured non-overlapping polygon representation.

6. An apparatus in a lithographic system, the apparatus comprising:
   means for receiving a design data describing a pattern to be generated;
   means for processing the received design data;
   means for generating a non-overlapping polygon representation of the design data based on the processing of the received design data;
   means for generating metadata from the non-overlapping polygon representation, wherein the generated metadata is associated with the pattern in an unfractured format, and wherein the metadata includes properties associated with at least one of corners and edges of the pattern;
   means for fracturing the non-overlapping polygon representation; and
   means for transmitting the fractured non-overlapping polygon representation and the metadata.

* * * * *